United States Patent
Sakurada et al.

(10) Patent No.: US 7,294,196 B2
(45) Date of Patent: Nov. 13, 2007

(54) SILICON SINGLE CRYSTAL WAFER, AN EPITAXIAL WAFER AND A METHOD FOR PRODUCING A SILICON SINGLE CRYSTAL

(75) Inventors: Masahiro Sakurada, Fukushima (JP);
Nobuaki Mitamura, Fukushima (JP);
Izumi Fusegawa, Fukushima (JP);
Tomohiko Ohta, Fukushima (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 234 days.

(21) Appl. No.: 10/512,470

(22) PCT Filed: May 7, 2003

(86) PCT No.: PCT/JP03/05720
§ 371 (c)(1),
(2), (4) Date: Oct. 26, 2004

(87) PCT Pub. No.: WO03/095716
PCT Pub. Date: Nov. 20, 2003

(65) Prior Publication Data
US 2005/0252441 A1 Nov. 17, 2005

(30) Foreign Application Priority Data
May 9, 2002 (JP) .............................. 2002-134675

(51) Int. Cl.
*C30B 15/20* (2006.01)
(52) U.S. Cl. .............................. 117/20; 117/13; 117/19
(58) Field of Classification Search .................. 117/13, 117/19, 20
See application file for complete search history.

(56) References Cited

U.S. PATENT DOCUMENTS
6,048,395 A 4/2000 Iida et al.
(Continued)

FOREIGN PATENT DOCUMENTS
EP 0 890 662 A1 1/1998
(Continued)

OTHER PUBLICATIONS
Voronkov, "The Mechanism of Swirl Defects Formation in Silicon," Journal of Crystal Growth, vol. 59, pp. 625-643 (1982).
(Continued)

*Primary Examiner*—Felisa Hiteshew
(74) *Attorney, Agent, or Firm*—Oliff & Berridge, PLC

(57) ABSTRACT

In a method for producing a silicon single crystal by Czochralski method, the single crystal is grown with controlling a growth rate between a growth rate at a boundary where a defect region detected by Cu deposition remaining after disappearance of OSF ring disappears when gradually decreasing a growth rate of silicon single crystal during pulling and a growth rate at a boundary where a high oxygen precipitation Nv region having a density of BMDs of $1 \times 10^7$ numbers/cm$^3$ or more and/or a wafer lifetime of 30 μsec or less after oxygen precipitation treatment disappears when gradually decreasing the growth rate further. Thereby, there is provided a silicon single crystal which does not belong to any of V region rich in vacancy, OSF region and I region rich in interstitial silicon, and has excellent electrical characteristics and gettering capability, so that yield of devices can be surely improved, and also an epitaxial wafer.

16 Claims, 7 Drawing Sheets

U.S. PATENT DOCUMENTS

| | | |
|---|---|---|
| 6,190,631 B1 | 2/2001 | Falster et al. |
| 6,348,180 B1 | 2/2002 | Iida et al. |
| 6,913,646 B2 * | 7/2005 | Sakurada et al. ............. 117/13 |
| 2002/0179003 A1 | 12/2002 | Iida et al. |

FOREIGN PATENT DOCUMENTS

| | | |
|---|---|---|
| EP | 1 074 643 A1 | 2/2001 |
| EP | 1 170 404 A1 | 1/2002 |
| EP | 1 347 083 A1 | 9/2003 |
| JP | A 04-192345 | 7/1992 |
| JP | A 2000-044388 | 2/2000 |
| WO | WO 01/79593 A1 | 10/2001 |

OTHER PUBLICATIONS

Sadamitsu et al., "Dependence of the Grown-in Defect Distribution on Growth Rates in Czochralski Silicon," Japanese Journal of Applied Physics, vol. 32, No. 9A, p. 3679 (Sep. 1993).

* cited by examiner

F I G. 1
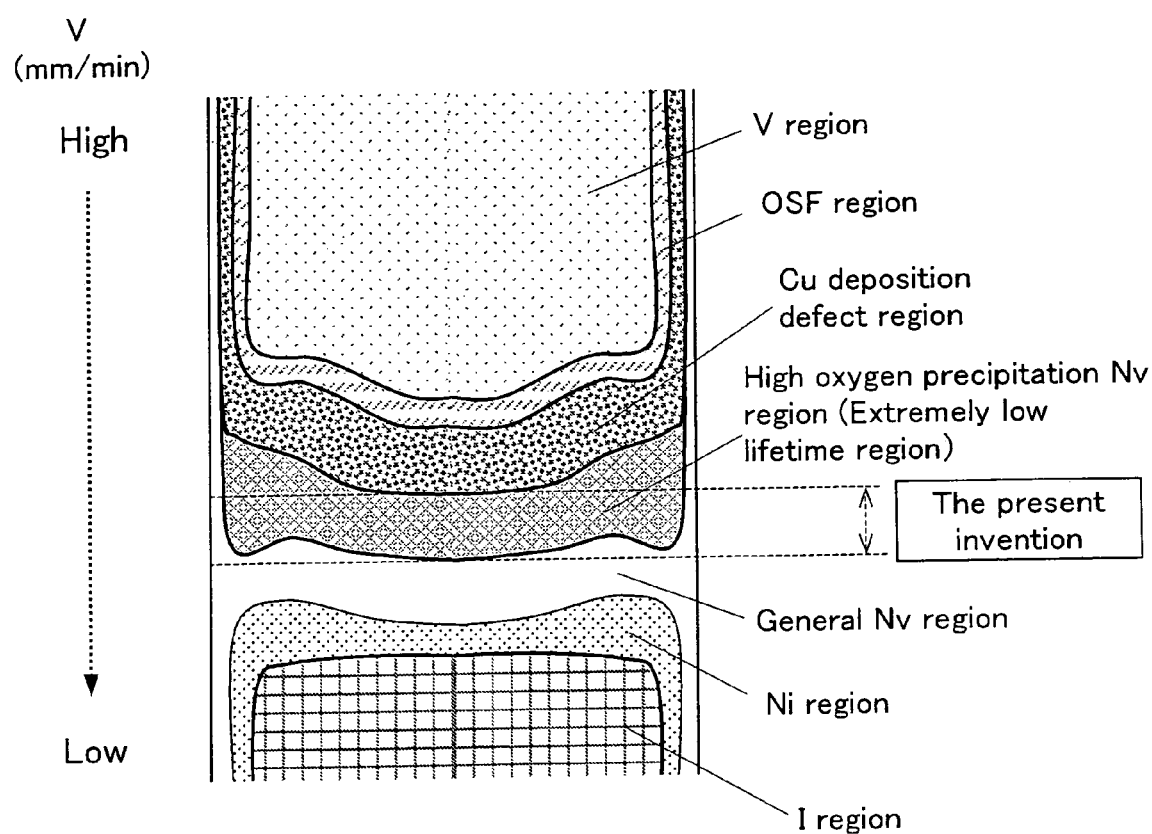

F I G. 5
(a)
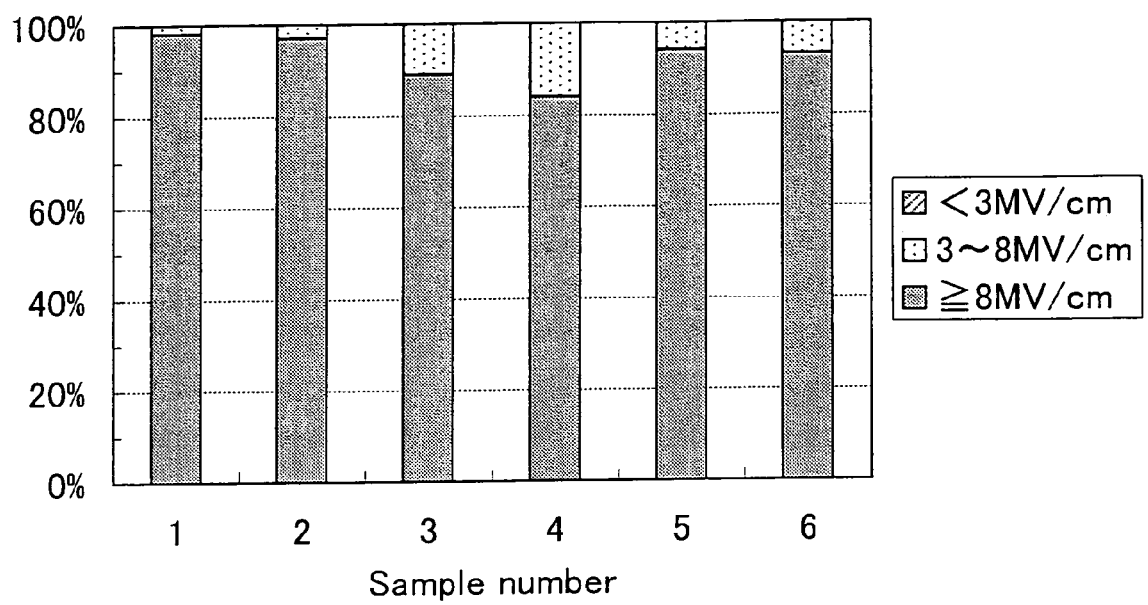
(b)
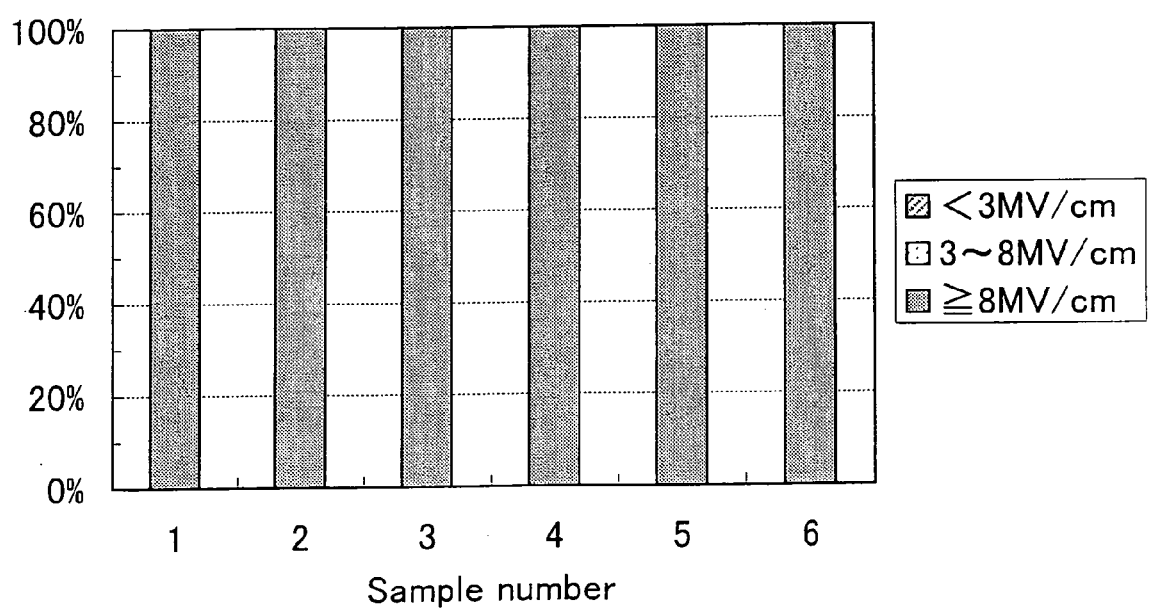

SILICON SINGLE CRYSTAL WAFER, AN EPITAXIAL WAFER AND A METHOD FOR PRODUCING A SILICON SINGLE CRYSTAL

TECHNICAL FIELD

The present invention relates to a silicon single crystal in N region having excellent electrical characteristics and gettering capability, in which any of defect regions such as V region, I region and OSF region as described below are not present and a defect region detected by Cu deposition does not exist either.

BACKGROUND ART

In recent years, in connection with miniaturization of devices accompanying higher integration of semiconductor circuits, a demand for quality of a silicon single crystal produced by Czochralski method (CZ method) which is used as a substrate thereof has been increasing. In particular, there exist defects introduced during growth of a single crystal, called grown-in defects such as FPD, LSTD and COP, which degrade oxide dielectric breakdown voltage characteristic and device characteristics. It has been considered that it is important to reduce a density and a size thereof.

For explanation of these defects, there will be given first general knowledge of factors determining a concentration of void-type point defects called vacancy (hereinafter occasionally abbreviated as "V") and a concentration of interstitial-type silicon point defects called interstitial silicon (hereinafter occasionally abbreviated as "I"), respectively, which are introduced into a silicon single crystal.

In a silicon single crystal, V region refers to a region which contains a large amount of vacancies, i.e., depressions, holes, or the like generated due to shortage of silicon atoms; and I region refers to a region which contains a large amount of dislocations and clusters of excess silicon atoms generated due to existence of excess silicon atoms. Further, between the V region and the I region, there exists a neutral (hereinafter occasionally abbreviated as "N") region which contains no (or little) excess and shortage of the atoms. It has become clear that the above-mentioned grown-in defects (such as FPDs, LSTDs and COPs) are generated due to agglomeration of point defects when V or I is present in a supersaturated state, but the point defects do not agglomerate so long as it is not saturated even when there is a little unevenness of atoms, and therefore do not exist as a grown-in defect.

FIG. 7 shows a growth rate of a single crystal and a defect distribution thereof. It has been confirmed that concentrations of the aforementioned both point defects depend on the relation between a pulling rate (growth rate) of the crystal in CZ method and a temperature gradient G near a solid-liquid interface in the crystal, and that another type of defect called OSF (oxidation induced stacking fault) is distributed in a ring shape (hereinafter occasionally referred to as OSF ring) near a boundary between the V region and the I region when the cross section perpendicular to the axis of crystal growth is observed.

When the growth rate is varied from a high speed to a low speed in the direction of the crystal growth axis by use of a CZ pulling apparatus with a general furnace structure (hot zone: HZ) having a large temperature gradient G near a solid-liquid interface of the crystal, these defects introduced during the crystal growth exist as in a distribution diagram of defects shown in FIG. 7.

These defects introduced during the crystal growth can be classified as follows. When the growth rate is relatively high, for example, about 0.6 mm/min or higher, grown-in defects such as FPDs, LSTDs and COPs which are considered to be generated due to voids consisting of agglomerated vacancy-type point defects are present at high density over the entire radial cross section of the crystal. The region where these defects are present is V region (See FIG. 7, line (A)).

When the growth rate is not higher than 0.6 mm/min, the OSF ring is generated from a circumferential portion of the crystal with decrease of the growth rate, and defects (huge dislocation clusters) of L/D (Large Dislocation, abbreviation of interstitial dislocation loop, LSEPD, LFPD or the like) which are considered to be generated due to dislocation loop consisting of agglomeration of interstitial silicons are present at low density outside the ring. The region where these defects are present is I region (occasionally referred to as L/D region). Furthermore, when the growth rate is decreased to about 0.4 mm/min or less, the OSF ring shrinks to the center of a wafer and disappears, so that I region spreads over the entire plane of the wafer (See FIG. 7, line (C)).

As shown in FIG. 7, there has been recently found existence of a region between V region and I region, and outside the OSF ring, called N region, where there exists none of the void-originated FPD, LSTD and COP, and the interstitial silicon-originated LSEPD and LFPD. It has been reported that the region is located outside the OSF ring, shows substantially no oxygen precipitation when the single crystal is subjected to heat treatment for oxygen precipitation and the contrast due to precipitates is observed through X-ray observation or the like, and exists on I region side where the interstitial silicon is not rich enough to form LSEPDs and LFPDs (See FIG. 7, line (B)).

Since such an N region is formed obliquely in the direction of the growth axis when the growth rate is lowered in a general method, it existed only in a part of a plane of wafer.

As for this N region, according to the Voronkov theory (V. V. Voronkov, Journal of Crystal Growth, 59 (1982) 625-643), it is proposed that total concentration of point defects is determined by a parameter called V/G which is a ratio of a pulling rate (V) and a temperature gradient (G) in the axis direction at the crystal solid-liquid interface. Considering the above theory, since the pulling rate (the growth rate) is almost constant in a plane and G has a distribution in the plane, for example, only a crystal wherein V region exists at the center and I region exists around it via N region could be obtained at a certain pulling rate.

Recently improvement of the distribution of G in a plane has been attempted. Then, although the N region could exist only obliquely, it has become possible to produce a crystal in which N region spreads over an entire transverse plane (an entire plane of a wafer) at a certain pulling rate, for example, when the crystal is pulled while gradually decreasing the pulling rate (the growth rate). Enlargement of the crystal having N region over the entire plane into a longitudinal direction can be achieved to some extent by pulling the crystal while maintaining the pulling rate at which the N region transversely spreads. Furthermore, by controlling the pulling rate so that V/G value may be persistently constant while considering that G is varied with growth of the crystal and compensating it, it has also become possible to enlarge the crystal having N region over the entire plane into the direction of growth to some extent.

And also recently, as further classification of the N region, it is known that there exist Nv region (a region where a lot of vacancies exist) adjacent to the outside of the OSF ring and Ni region (a region where a lot of interstitial silicons exist) adjacent to I region, and that the amount of precipitated oxygen becomes large in the Nv region when thermal oxidation treatment is carried out, and substantially no oxygen precipitation is generated in the Ni region.

Therefore, as shown in FIG. 8, in a conventional crystal growth in N region, there is a tendency to obtain a silicon wafer occupied by N region over the entire plane by growing a silicon single crystal in N region including together Nv region where the amount of precipitated oxygen is large and Ni region where substantially no oxide precipitation layer is formed, without distinguishing them, or in either Nv region or Ni region.

However, it has been found that there are some cases that oxide-film defects occur remarkably in spite of a single crystal wherein the N region occupies the entire plane, an OSF ring is not generated when thermal oxidation treatment is carried out, and FPD and L/D do not exist over the entire plane as mentioned above. This may be a cause of degrading electrical characteristics such as oxide dielectric breakdown voltage characteristic. Accordingly, the fact that the N region merely occupies the entire plane as in a conventional crystal is not enough, and further improvement of electrical characteristics has been desired. Moreover, since dispersion of gettering capability occurs even if the crystals are grown in the above-described Nv region where the oxygen precipitation is large, yield of devices may not be necessarily improved. Accordingly, further improvement of quality has been desired.

DISCLOSURE OF THE INVENTION

An object of the present invention is to provide a silicon single crystal, which does not belong to any of V region rich in vacancy, OSF region and I region rich in interstitial silicon when producing the silicon single crystal by Czochralski method, has excellent electrical characteristics and gettering capability, and can surely improve yield of devices, and such an epitaxial wafer.

To achieve the above-mentioned object, according to the present invention, there is provided a silicon single crystal wafer grown by Czochralski method, wherein the wafer is within a region which is N region outside OSF generated in a ring shape when performing thermal oxidation treatment and doesn't include a defect region detected by Cu deposition, and at least the center of the wafer is within a high oxygen precipitation Nv region which has a density of BMDs of $1 \times 10^7$ numbers/cm$^3$ or more and/or a wafer lifetime of 30 μsec or less after oxygen precipitation treatment.

Such a silicon single crystal wafer is occupied by N region where a defect such as FPD in V region, a huge dislocation cluster (LSEPD, LFPD) in I region and an OSF defect are not formed, and a defect detected by Cu deposition (Cu deposition defect) does not exist. The wafer has an extremely high gettering capability due to high precipitation of oxygen enough to lower wafer lifetime, and in addition, excellent electrical characteristics due to high oxide dielectric breakdown voltage. Therefore, yield of devices can be surely improved.

In this case, it is preferable that the high oxygen precipitation Nv region exists in a region of 80% or more of a plane of the wafer.

The high oxygen precipitation Nv region as described above preferably occupies a larger region in a plane of the wafer. If a wafer of which a region of 80% or more in the plane is the high oxygen precipitation Nv region is used, almost an entire wafer has an sufficiently high gettering capability, and thereby yield of devices can be satisfactorily improved.

Furthermore, an epitaxial wafer wherein an epitaxial layer is formed on the aforementioned silicon single crystal wafer is provided.

In the case of such an epitaxial wafer, a defect-free epitaxial layer is formed, and therefore an epitaxial wafer excellent in both electrical characteristics and gettering capability can be obtained.

Further according to the present invention, there is provided a method for producing a silicon single crystal by Czochralski method, wherein the single crystal is grown in a region which is within N region outside OSF generated in a ring shape when performing thermal oxidation treatment and doesn't include a defect region detected by Cu deposition, and in which at least the center of the single crystal is within a high oxygen precipitation Nv region which has a density of BMDs of $1 \times 10^7$ numbers/cm$^3$ or more and/or a wafer lifetime of 30 μsec or less after oxygen precipitation treatment.

In accordance with such a production method, when the grown single crystal is processed into a wafer, there can be obtained a silicon single crystal wafer which is occupied by N region where a defect such as FPD in V region, a huge dislocation cluster in I region and an OSF defect are not formed, has no Cu deposition defect, and has a gettering capability due to generation of oxygen precipitation enough to lower wafer lifetime, as well as excellent electrical characteristics.

In this case, the single crystal is preferably grown so that the high oxygen precipitation Nv region exists in a region of 80% or more of a plane.

If the silicon single crystal is grown so that the high oxygen precipitation Nv region occupies a region of 80% or more of a plane, a silicon single crystal wafer having an extremely high gettering capability over almost the entire plane can be surely obtained.

Further, as another method, there is provided a method for producing a silicon single crystal by Czochralski method, wherein the single crystal is grown with controlling a growth rate between a growth rate at a boundary where a defect region detected by Cu deposition remaining after disappearance of OSF ring disappears when gradually decreasing a growth rate of silicon single crystal during pulling and a growth rate at a boundary where a high oxygen precipitation Nv region having a density of BMDs of $1 \times 10^7$ numbers/cm$^3$ or more and/or a wafer lifetime of 30 μsec or less after oxygen precipitation treatment disappears when gradually decreasing the growth rate further.

In accordance with such a method also, there can be obtained a silicon single crystal wafer in which V region defect such as FPD, I region defect such as huge dislocation cluster, and OSF defect are not formed and Cu deposition defect does not exist either, and which has excellent electrical characteristics and gettering capability.

In this case, the oxygen precipitation treatment preferably comprises steps of performing a pretreatment in a nitrogen atmosphere of 400-700° C. for 20 minutes-5 hours, subsequently performing a dry oxidation at 700-900° C. for 3-5 hours, and then performing a dry oxidation treatment at 900-1100° C. for 10-20 hours.

If a silicon single crystal is grown as described above using as a criterion the density of BMDs and/or wafer lifetime measured after such oxygen precipitation treatment, a silicon single crystal wafer having a desired gettering capability can be surely obtained.

It is preferable that the single crystal is grown with controlling initial oxygen concentration in the silicon single crystal to 20 ppma (ASTM' 79) or more.

If the silicon single crystal is grown with controlling the initial oxygen concentration to the above-described value, a silicon single crystal wafer having an especially excellent gettering capability after heat treatment for oxygen precipitation can be obtained.

As described above, according to the present invention, there can be provided a silicon single crystal which does not belong to any of V region rich in vacancy, OSF region, Cu deposition defect region and I region rich in the interstitial silicon when producing the silicon single crystal by Czochralski method, and has excellent electrical characteristics and gettering capability owing to high breakdown voltage and high precipitation. Furthermore, there can be also provided an epitaxial wafer having excellent gettering capability in which no defect is formed in an epitaxial layer by using such a silicon wafer. Yield in a device process can be significantly improved by using such a silicon wafer or an epitaxial wafer.

BRIEF EXPLANATION OF THE DRAWINGS

FIG. 1 is an explanatory view showing a relation between a growth rate in high oxygen precipitation Nv region according to the present invention and a crystal defect distribution.

FIG. 5 is a view showing a result of measurement of a level of the oxide dielectric breakdown voltage in Nv region:

(a) a region where defects due to Cu deposition are generated, (b) Nv region where no defect is generated.

Figure 6:
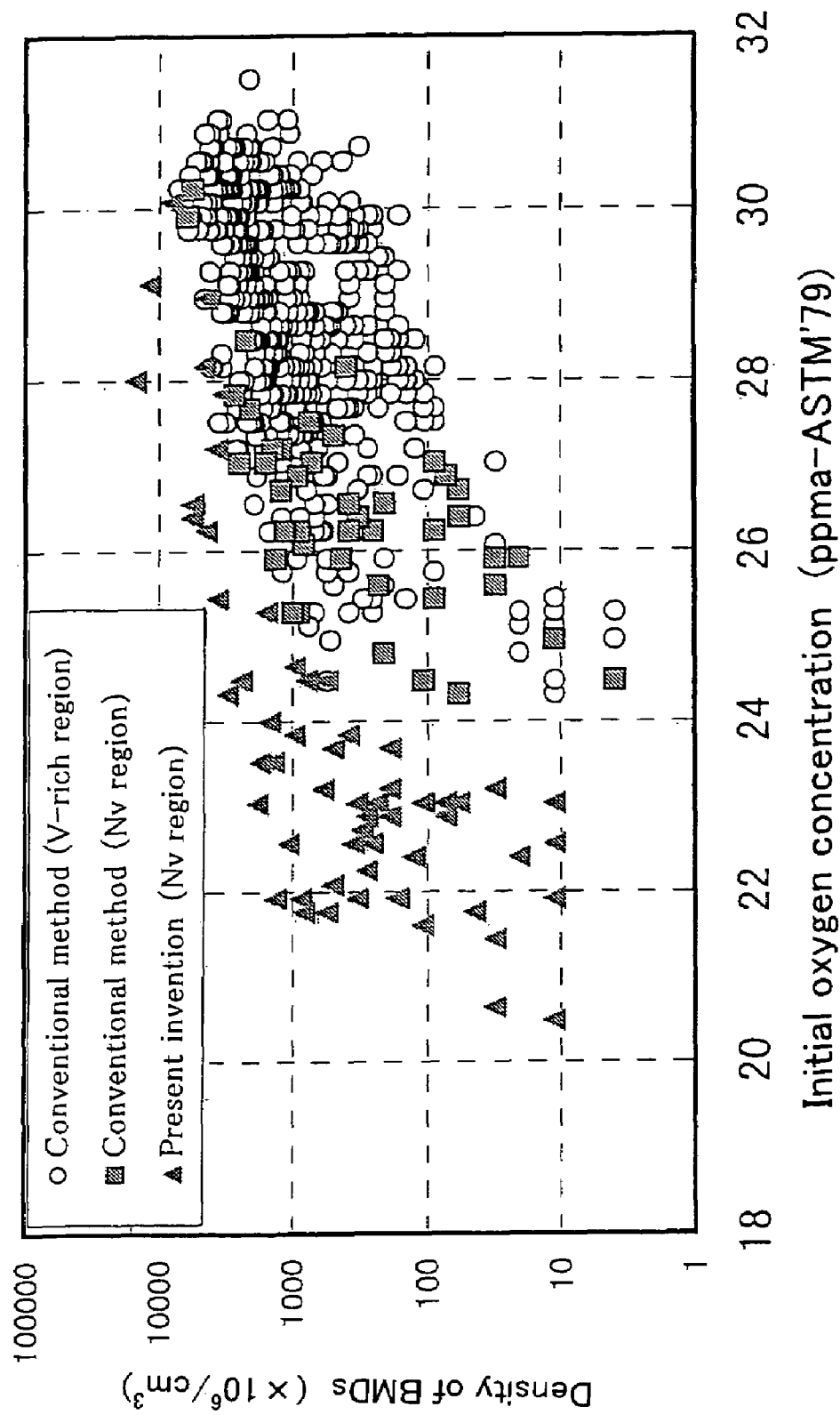

FIG. 6 is a diagram showing a relation between an initial oxygen concentration and a density of BMDs after oxygen precipitation treatment.

Figure 7:
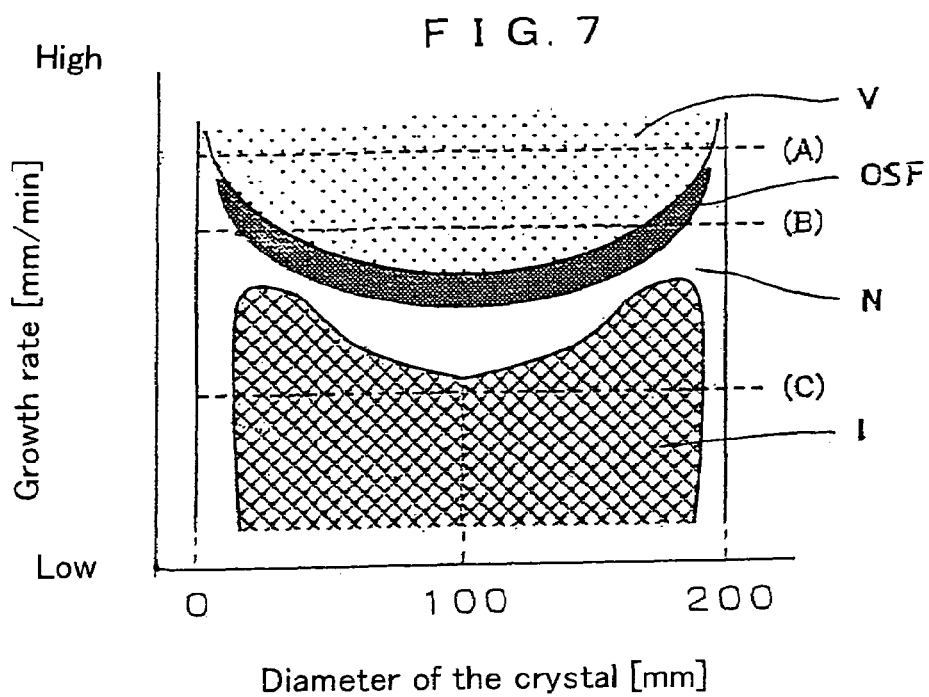

FIG. 7 is an explanatory view showing a growth rate and a defect distribution of a crystal in the prior art.

Figure 8:
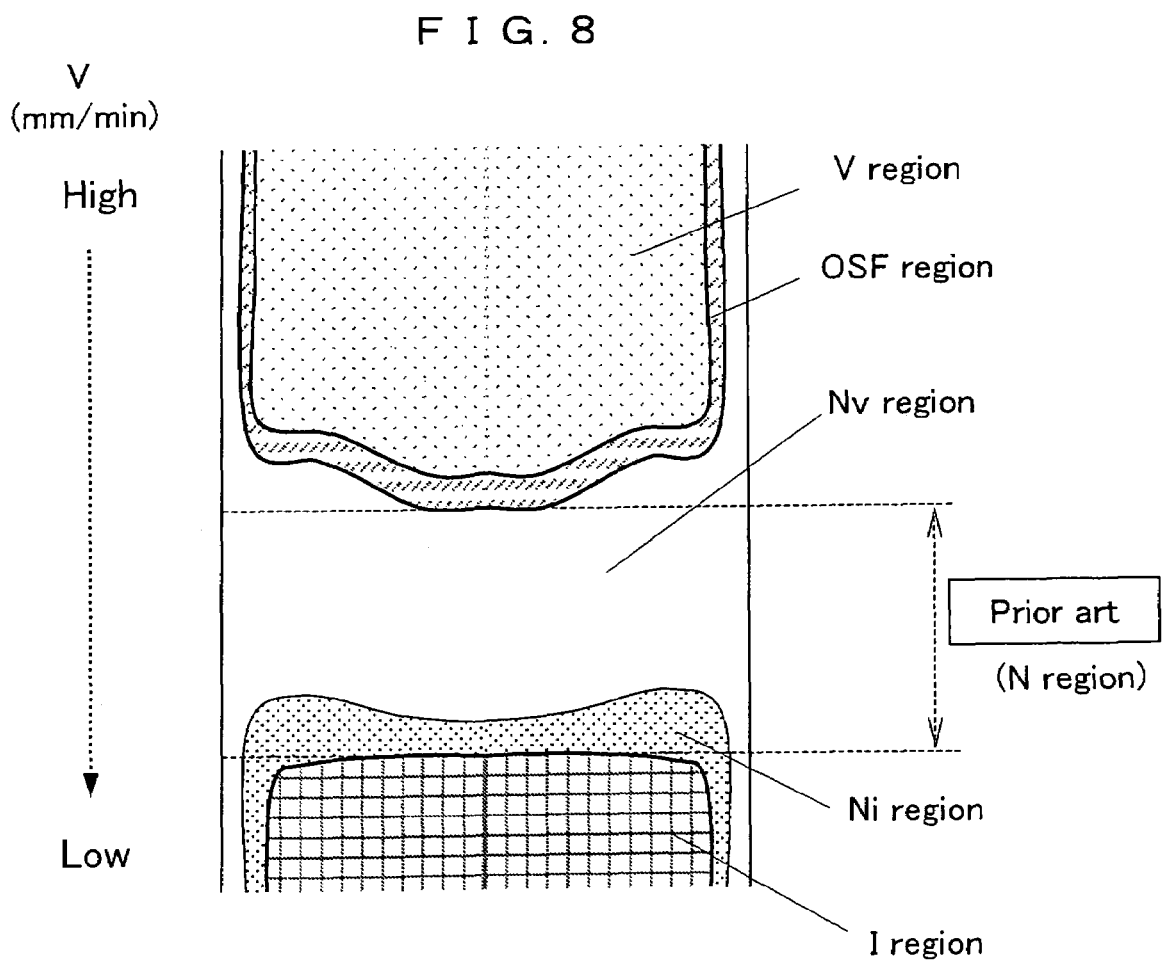

FIG. 8 is an explanatory view showing a relation between a growth rate in the growth in N region according to a conventional method and a crystal defect distribution.

BEST MODE FOR CARRYING OUT THE INVENTION

Hereinafter, the present invention will be explained in more detail, but the present invention is not limited thereto. In advance of the explanation, some terms will be explained beforehand.

1) As for FPD (Flow Pattern Defect), pits and ripple patterns are generated by slicing a wafer from a grown silicon single crystal ingot, removing a damaged layer of its surface through etching with a mixed solution of hydrofluoric acid and nitric acid, and then subjecting the surface to etching with a mixed solution of $K_2Cr_2O_7$, hydrofluoric acid and water (Secco etching). The ripple pattern is referred to as FPD. As a density of FPDs in a plane of the wafer increases, failure with regard to oxide dielectric breakdown voltage increases (see Japanese Patent Laid-Open (kokai) No. 4-192345).

2) As for SEPD (Secco Etch Pit Defect), when Secco etching is performed in the same manner as in the case of FPD, a defect which involves flow pattern is referred to as FPD, and a defect which involves no flow pattern is referred to as SEPD. In the SEPDS, it is considered that a large SEPD having a size of 10 μm or more (LSEPD) is caused by dislocation clusters. When dislocation clusters are present in a device, current leaks through the dislocation, and consequently the function as P-N junction is not served.

3) As for LSTD (Laser Scattering Tomography Defect), a wafer is sliced from a grown silicon single crystal ingot, a damaged layer of the surface is removed through etching with a mixed solution of hydrofluoric acid and nitric acid, and then the wafer is cleaved. When infrared light enters into the wafer through the cleavage plane, scattering light due to the defects existing in the wafer can be detected by detecting light that comes out from the wafer surface. A scattering defect observed at this moment has already been reported at an academic conference or the like, and it is considered to be an oxide precipitate (see Jpn. J. Appl. Phys. Vol. 32, P3679, 1993). Further, according to recent researches, it has also been reported to be an octahedral void (hole).

4) COP (Crystal Originated Particle) is a defect that leads to degradation of the dielectric breakdown voltage of oxide film at the central portion of a wafer. The defect which appears as FPD in the case of Secco etching appears as COP by SC-1 cleaning (cleaning by using a mixed solution of $NH_4OH:H_2O_2:H_2O=1:1:10$) which serves as a preferential etchant. The pit has a diameter of 1 μm or less, and it is examined by a light scattering method.

5) L/D (Large Dislocation: abbreviation of interstitial dislocation loop) contains LSEPD, LFPD and the like, and it is a defect considered to be generated due to dislocation loops which is an agglomeration of interstitial silicons. As described above, LSEPD is SEPD having a size not less than 10 μm. LFPD is a large FPD whose tip end pit has a size not less than 10 μm, and it is also considered to be generated due to dislocation loops.

6) Cu deposition method is a method for evaluating a wafer, by which positions of defects in a semiconductor wafer can be accurately measured, detection limit for defects in the semiconductor wafer can be improved, and finer defects can be accurately measured and analyzed.

The specific evaluation method of a wafer comprises forming an oxide film with a predetermined thickness on a surface of the wafer and destroying the oxide film on the defect part formed near the surface of the wafer to deposit electrolytes, such as Cu, at the defect part (deposition). That is, the Cu deposition method is an evaluation method using the fact that when electric potential is applied to an oxide film formed on the surface of the wafer in liquid where Cu ions are dissolved, electric current flows through the part where the oxide film is degraded, and Cu ions are precipitated as Cu at that part. It is known that defects such as COPs exist in the part where an oxide film is apt to be degraded.

The defect part of the wafer where Cu is deposited can be analyzed with the naked eye under a collimated light or directly to evaluate a distribution and a density thereof. Furthermore, it can also be observed by a microscope, a transmission electron microscope (TEM), a scanning electron microscope (SEM), or the like.

7) BMD (Bulk Micro Defect) is an oxide precipitate in which interstitial oxygen dissolved as a supersaturated solid solution in a CZ silicon crystal is precipitated as $SiO_2$ and so forth. When BMDs are present inside a wafer, they can contribute to intrinsic gettering (IG).

Even if crystals are grown in N region free of grown-in defects, some of them are inferior in oxide dielectric breakdown voltage. In order to investigate the cause thereof, the inventors of the present invention have studied the N region further in detail by the Cu deposition method, and found that there existed a region where defects detected by Cu deposition treatment are generated remarkably, which is in N region of the outside of an OSF region (Nv region) and which is a part of a region where oxygen precipitation is apt to occur after precipitation heat treatment. Furthermore, they have found that this was a cause of degradation of electrical characteristics such as oxide dielectric breakdown voltage characteristic.

Accordingly, if the region which is in N region outside OSF and doesn't include a defect region detected by Cu deposition (Cu deposition defect region) can be enlarged over an entire plane of a wafer, a wafer which does not have the above-mentioned various grown-in defects and has improved oxide dielectric breakdown voltage characteristic can be obtained.

However, when silicon single crystals were grown in Nv region which did not include the aforementioned Cu deposition defect region and wafers were manufactured therefrom, although oxide dielectric breakdown voltage characteristic was improved, there were some cases that a dispersion of the gettering capabilities were large and thereby an efficient gettering effect could not be obtained. Thus, if the gettering capabilities are not efficient, yield in a device process may be decreased.

Accordingly, the inventors of the present invention have investigated in detail the amount of precipitated oxygen in a silicon single crystal grown in Nv region in order to clear up the cause of degradation of a gettering capability. As a result, it was found that the amount of precipitated oxygen in Nv region was largest in the vicinity of OSF, and the distribution thereof was decreasing as it came nearer Ni region, so that there was a significant dispersion. Namely, it was found that even if a silicon single crystal was grown in Nv region, the amount of precipitated oxygen was insufficient in Nv region near Ni region, and therefore a sufficient gettering capability could not be obtained.

Furthermore, the inventors of the present invention have studied in detail a silicon wafer grown in Nv region, and as a result, it was found that if it was a silicon single crystal wafer within Nv region (high oxygen precipitation Nv region) which contained none of V region, OSF region, I region and Cu deposition defect region, and which showed BMD density of $1 \times 10^7$ numbers/cm$^3$ or more and/or wafer lifetime (WLT) of 30 μsec or less after oxygen precipitation treatment, it became a silicon single crystal wafer in N region, which extremely excelled in not only electrical characteristics but gettering capability due to high breakdown voltage and high precipitation. Thus, they have completed the present invention.

Hereinafter, the present will be explained in more detail with reference to the drawings, but the present invention is not limited thereto.

Figure 2:
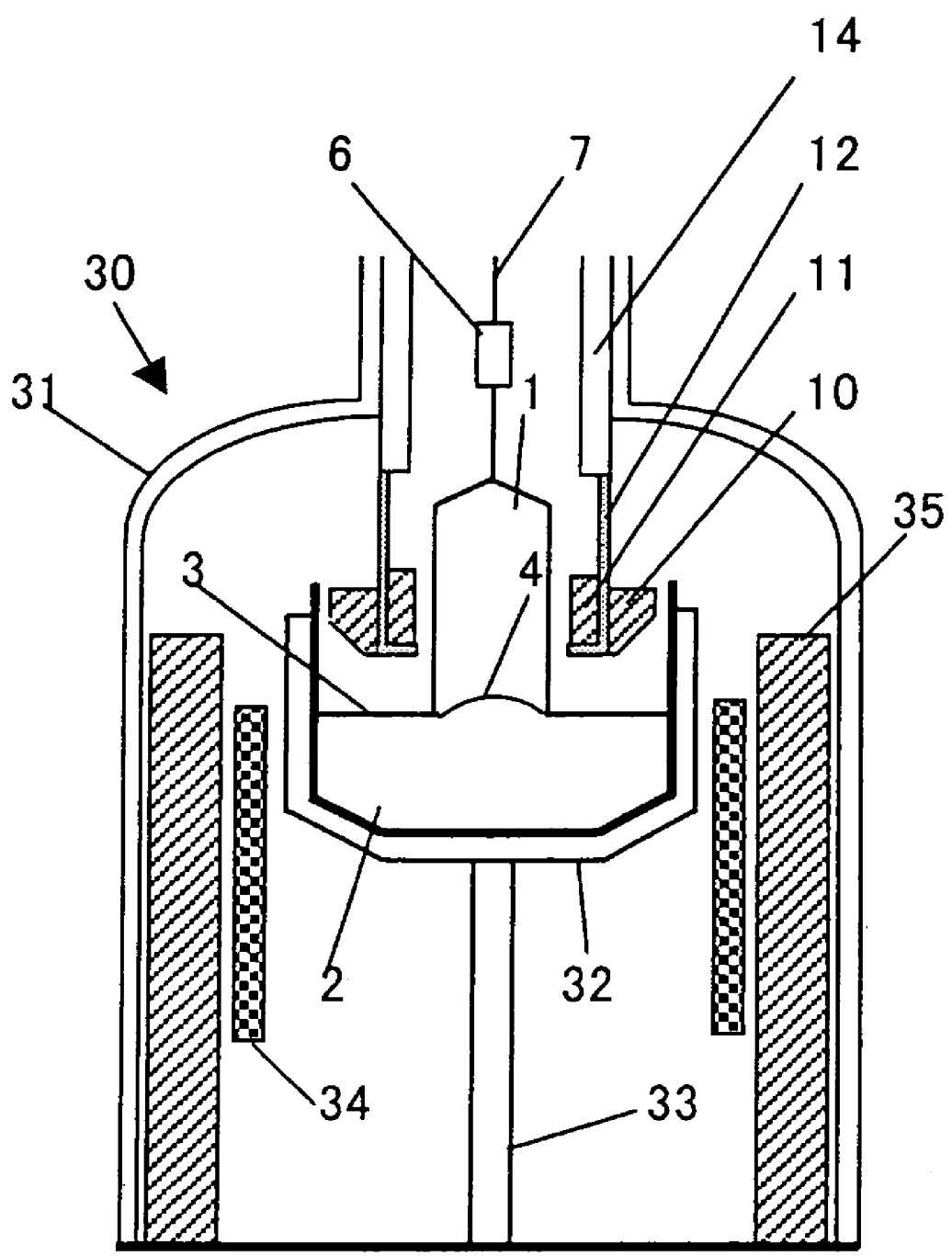
FIG. 2 is an example of an apparatus for producing a CZ silicon single crystal that can be used in the present invention.

FIG. 2 shows an example of an apparatus for producing a single crystal that can be used when manufacturing a silicon single crystal wafer of the present invention. This apparatus 30 for pulling a single crystal comprises a pulling chamber 31, a crucible 32 provided in the pulling chamber 31, a heater 34 disposed around the crucible 32, a crucible holding shaft 33 and a rotation mechanism thereof (not shown) for rotating the crucible 32, a seed chuck 6 for holding a silicon seed crystal, a wire 7 for pulling the seed chuck 6, and a winding mechanism (not shown) for rotating or winding up the wire 7. A heat insulation material 35 is disposed around the outside of the heater 34.

The crucible 32 is composed of an inner quartz crucible for accommodating a silicon melt (melt) 2 and an outer graphite crucible located outside the quartz crucible.

Recently, it is also often the case that a method, so-called MCZ method, is used in which magnets not shown are disposed horizontally outside the pulling chamber 31, and a magnetic field in the horizontal direction, the vertical direction, or the like is applied to the silicon melt 2 to inhibit convection of the melt and achieve stable growth of a single crystal.

Further, an annular graphite cylinder (heat shielding plate) 12 is provided in order to set manufacturing conditions regarding manufacturing method of the present invention, and moreover an annular outer heat insulation material 10 is provided around the outside of the vicinity of a solid-liquid interface 4 of the crystal. The outer heat insulation material 10 is disposed so that a gap of 2-20 cm is formed between its lower end and a surface 3 of the silicon melt 2. Thereby, difference between a temperature gradient Gc [° C./cm] at the center part of the crystal and a temperature gradient Ge in the periphery of the crystal becomes small, and it is also possible to control temperature inside a furnace so that, for example, the temperature gradient in the periphery of the crystal is lower than that at the center of the crystal.

The outer heat insulation material 10 is located outside the graphite cylinder 12, and also inside the graphite cylinder 12, an inner heat insulation material 11 is provided. A cooling cylinder 14 is placed on the graphite cylinder 12 to perform forced cooling by flowing refrigerant inside. Furthermore, it is also possible to provide a cylindrical cooling means that cools the single crystal by blowing cooling gas or shielding radiant heat.

In order to produce a silicon single crystal using such an apparatus 30 for pulling a single crystal, first, highly pure polycrystalline raw material of silicon is heated to the melting point (approximately 1420° C.) or higher to be melted in the crucible 32. Then, a tip end of the seed crystal is brought into contact with or immersed in the approximately central portion of the surface of the melt 2 by unwinding the wire 7. Subsequently, while the crucible holding shaft 33 is rotated, the wire 7 is wound up with being rotated. Thereby, the seed crystal is also pulled with rotating, and growth of a silicon single crystal is initiated. Then, an approximately columnar single crystal ingot 1 can be obtained by adequate control of a pulling rate and temperature.

In a conventional growth of defect-free crystal, a silicon single crystal has been grown in entire N region, or in either Nv region or Ni region. However, in the present invention, a single crystal is grown in a region which is within N region outside OSF generated in a ring shape when performing heat oxidation treatment and doesn't include a defect region detected by Cu deposition, and in which at least the center of the single crystal is within a high oxygen precipitation Nv region which has a density of BMDs of $1 \times 10^7$ numbers/cm$^3$ or more and/or wafer lifetime of 30 μsec or less after oxygen precipitation treatment. If a single crystal is grown as described above and processed into a wafer, the wafer is occupied by a defect-free region over a large area ranging from the center of the wafer to its periphery, and further has extremely high gettering capability and excellent electric characteristics through oxygen precipitation treatment. Thereby, yield of devices can be surely improved.

FIG. 1 shows a growth rate in the high oxygen precipitation Nv region of the present invention as described above. As shown in this figure, when a growth rate of a silicon single crystal during pulling is gradually decreased from high speed to low speed from a shoulder of the crystal through a tail of a straight body thereof, respective phases in order of V region, OSF ring region, Cu deposition defect region, Nv region, Ni region and I region (huge dislocation cluster generating region) are formed depending on its growth rate. In the present invention, an entire single crystal may be grown in Nv region with controlling the growth rate between a growth rate at a boundary where a defect region detected by Cu deposition remaining after disappearance of OSF ring disappears, and a growth rate at a boundary where the high oxygen precipitation Nv region which shows a density of BMDs of $1 \times 10^7$ numbers/cm$^3$ or more and/or wafer lifetime of 30 μsec or less after oxygen precipitation treatment disappears when gradually decreasing the growth rate further. If a silicon single crystal is grown as described above, at least the center of the single crystal is the high oxygen precipitation Nv region (extremely low lifetime region) as shown in FIG. 1, and therefore a single crystal in which the high oxygen precipitation Nv region exists in a region of, for example, 50% or more from the center through the periphery, or 80% or more in a plane can be easily grown.

When a single crystal is grown with controlling the growth rate so as to be such a high oxygen precipitation Nv region (extremely low lifetime region) and is processed into a wafer, it is possible to obtain a silicon wafer which does not contain V region defects such as FPDs, I region defects such as huge dislocation clusters (LSEPD, LFPD) and OSF defects, and also does not have defects detected by Cu deposition, and further in which oxide precipitates equal to or larger than that in V region are formed in a bulk when oxygen precipitation treatment is performed under a nitrogen and dry oxygen atmosphere thereby to have not only good oxide dielectric breakdown voltage but extremely excellent gettering capability.

The density of BMDs varies depending on temperature and time for oxygen precipitation treatment. It is preferable that the oxygen precipitation treatment of the present invention is performed based on treatment comprising steps of performing a pretreatment in a nitrogen atmosphere of 400-700° C. for 20 minutes-5 hours, subsequently performing a dry oxidation at 700-900° C. for 3-5 hours, and then performing a dry oxidation treatment at 900-1100° C. for 10-20 hours. That is, if Nv region is regarded as a criterion, in which when a density of BMDs in a bulk or wafer lifetime is measured after performing the above-described oxygen precipitation treatment, values thereof show $1 \times 10^7$ numbers/cm$^3$ or more or 30 μsec or less, respectively, and a silicon single crystal wafer in such a high oxygen precipitation Nv region is obtained, the wafer has extremely excellent gettering capability and can improve yield in a device process.

It is desirable that the entirety of a wafer (100%) is occupied by the high oxygen precipitation Nv region of the present invention. However, in practice a region free of defects and oxide precipitates is necessarily generated due to out-diffusion on the periphery of the crystal, as shown in FIG. 1. Accordingly, if 80% or more in a plane of the wafer is occupied by the high oxygen precipitation Nv region, high oxygen precipitation is attained in the most part of the wafer by oxygen precipitation treatment, and therefore yield in a device process can be sufficiently improved.

As for the high oxygen precipitation Nv region of the present invention, it is also possible to increase the amount of precipitated oxygen significantly (more than twice larger than that in the general Nv region), for example, by controlling initial oxygen concentration or lengthening time for passing through a low temperature region of 900° C. or less of a growing silicon single crystal. When the initial oxygen concentration is too low, the amount of precipitated oxygen enough to develop high gettering capability may not be obtained even if the wafer is subjected to oxygen precipitation treatment. Therefore, it is preferable to grow a single crystal by controlling the initial oxygen concentration to 20 ppma (ASTM' 79) or more.

Furthermore, on the occasion of growing a silicon single crystal, if the single crystal is grown at a growth rate of 0.5 mm/min or more through HZ structure in which a temperature gradient G near solid-liquid interface in the crystal is large, a production margin is enlarged. Thereby, it is possible to easily realize mass-production.

And also, by using a silicon single crystal wafer as described above, an epitaxial wafer having no defect and being excellent in electrical characteristics and gettering capability can also be obtained. Namely, since a silicon single crystal wafer according to the present invention has none of defects in V region, I region, and OSF region, if an epitaxial layer is formed on its surface, an epitaxial layer made of single crystal silicon without defects can be formed, and an epitaxial wafer excellent also in gettering capability of its substrate can be obtained.

The present invention will be explained hereinafter in reference to examples, however, the present invention is not limited thereto.

(Experiment 1): Confirmation of High Oxygen Precipitation Nv Region

An experiment on gradual lowering of a crystal growth rate was carried out as explained below using the apparatus 30 for manufacturing a single crystal shown in FIG. 2 to research growth rates at boundaries of respective regions.

120 kg of polycrystalline silicon as a raw material was charged into a quartz crucible having a diameter of 24 inches (600 mm), and a silicon single crystal having a diameter of 8 inches (200 mm) and orientation of <100> was grown. The single crystal was grown so that oxygen concentration in the wafer might be 24-27 ppma (ASTM+ 79 value). When growing the single crystal, the growth rate was controlled so as to gradually decrease linearly from 0.70 mm/min to 0.30 mm/min in a range from a point of 10 cm of a straight body through a tail.

Figure 3:
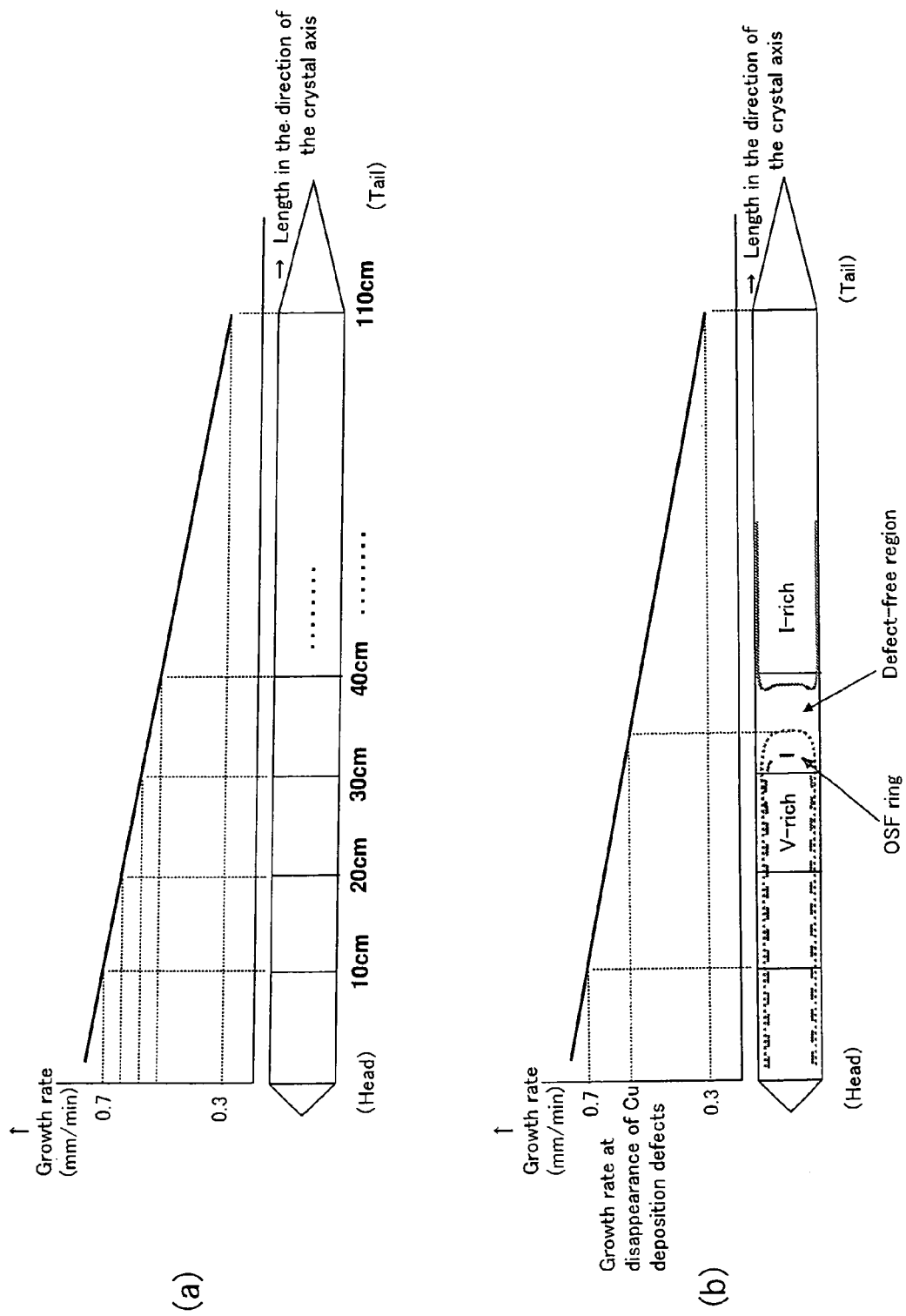
FIG. 3(a) is a view showing a relation between a growth rate of a single crystal and a cutting position of the crystal.
FIG. 3(b) is an explanatory view showing a growth rate and respective regions.

The straight body of each silicon single crystal ingot grown as described above was cut into blocks by a length of 10 cm in the direction of a crystal growth axis as shown in FIG. 3(a), and thereafter each block was further cut lengthwise in the direction of the crystal growth axis to produce several samples having a thickness of about 2 mm.

As to the aforementioned samples, a distribution of each of V region, OSF region and I region, a distribution of FPD, LEP, or the like, and generation of OSF by OSF heat treatment were investigated by means of WLT measuring instrument (SEMILAB WT-85) and Secco etching, and further Cu deposition defect region, a density of BMDs, and the like were also investigated. Thereby the growth rates at boundaries of respective regions were confirmed. A result thereof is shown in FIG. 3(b).

To be specific, each sample was ground to be flat, then it was subjected to mirror-etching and Secco etching (for 30 minutes), and was left without stirring. After predetermined treatment, a density of each defect was measured. As to evaluation of OSF, each sample was subjected to heat treatment at 1150° C. for 100 minutes (under a wet oxygen atmosphere), and subsequently cooled (taken out at 800° C.). After removing an oxide film by use of an agent, OSF ring pattern was observed and the density was measured.

Figure 4:
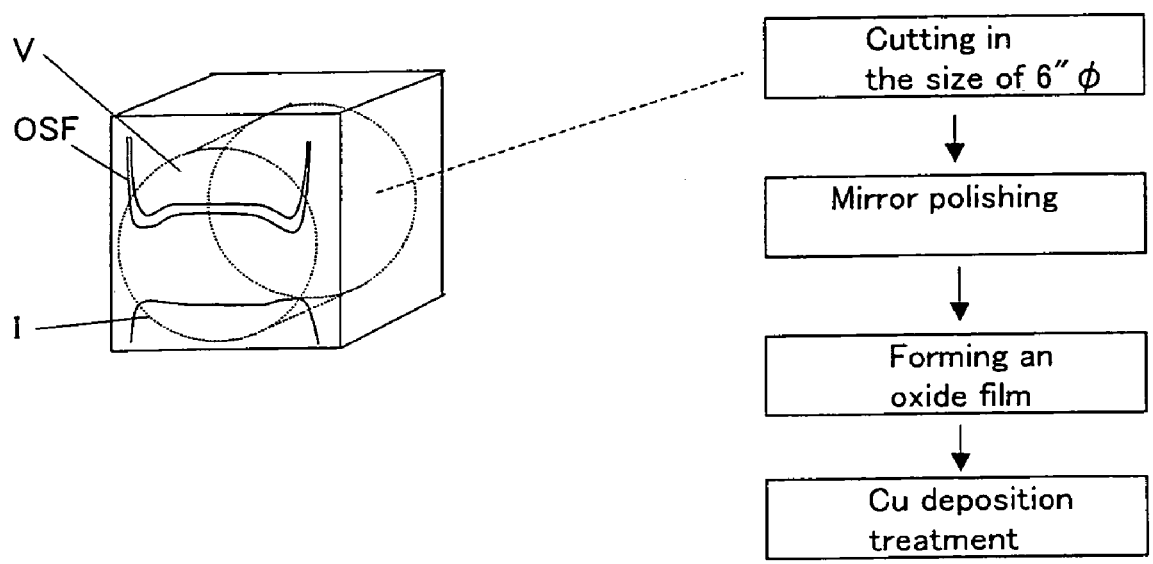
FIG. 4 is an explanatory view illustrating a method of manufacturing a sample for Cu deposition evaluation.

As for Cu deposition defect region, a sample was cut in a shape of a wafer with a diameter of 6 inches (150 mm) as shown in FIG. 4, a thermal oxide film was formed on a surface of the wafer after mirror-polishing. Then, it was subjected to Cu deposition treatment, and a distribution of oxide-film defects was observed. Evaluation conditions were as follows:
  oxide film: 25 nm,
  intensity of electric field: 6 MV/cm,
  time of impressed voltage: 5 minutes.

FIG. 5(a) shows a result of evaluating Nv region where defects were generated by Cu deposition, and (b) shows a result of evaluating Nv region where defect was not generated by Cu deposition.

Each sample was processed into a mirror-polished wafer, and its oxide dielectric breakdown voltage characteristic was evaluated. C-mode measurement conditions were as follows.
  1) oxide film: 25 nm,
  2) measuring electrode: phosphorus-doped polysilicon,
  3) area of electrode: 8 mm$^2$,
  4) current in decision: 1 mA/cm$^2$.

Conditions of oxygen precipitation treatment in the case of evaluating a density of BMDs and wafer lifetime after the oxygen precipitation treatment were as follows:
  first step: at 650° C. in a nitrogen atmosphere for 2 hours;
  second step: dry oxidation at 800° C. for 4 hours;
  third step: dry oxidation treatment at 1000° C. for 16 hours, and subsequent cooling.

The growth rates at boundaries of respective regions could be confirmed through the investigation and measurement above. A result was shown in Table 1.

TABLE 1

| Boundary | Growth rate (mm/min) |
| --- | --- |
| OSF disappearing boundary | 0.571 |
| Cu deposition defect region/ high oxygen precipitation Nv region boundary | 0.562 |
| high oxygen precipitation Nv region disappearing boundary | 0.540 |
| Nv disappearing boundary | 0.529 |
| Ni region/I region boundary | 0.520 |

(Experiment 2): Growth of a Silicon Single Crystal Having High Oxygen Precipitation Nv Region From the result shown in Table 1, a silicon single crystal was pulled with controlling a growth rate of 0.562-0.540 mm/min so that the single crystal could be grown in the high oxygen precipitation Nv region of the present invention. Then, the grown single crystal was processed into a mirror-polished silicon wafer, and each quality of the wafer was evaluated. A result thereof was shown in Table 2.

TABLE 2

| Item | Evaluation |
| --- | --- |
| FPD | Not generated |
| LFPD, LSEP | Not generated |
| OSF | Not generated |
| Cu deposition defect | Not generated |
| Oxide dielectric breakdown voltage (C mode) | 100% |
| Density of BMDs | 5 × 10$^8$ numbers/cm$^3$ or more in 80% or more of a plane |
| WLT | 20 μ sec or less in 80% or more of a plane |

From the result of Table 2, it is found that, when a silicon single crystal is grown in the high oxygen precipitation Nv region, a silicon wafer can be obtained, which does not contain a V region defect such as FPD, an I region defect such as a huge dislocation cluster (LSEPD, LFPD) and an OSF defect and does not have a defect detected by Cu deposition either, and which has excellent oxide dielectric breakdown voltage, extremely high density of BMDs, extremely short wafer lifetime, and excellent gettering capability.

(Experiment 3): Relation Between Initial Oxygen Concentration and a Density of BMDs A silicon single crystal was grown in the high oxygen precipitation Nv region according to the present invention, and it was processed into a wafer to measure initial oxygen concentration. Subsequently, oxygen precipitation treatment was conducted in the same manner as described above, and then a density of BMDs was measured.

Further, a silicon single crystal was grown in V region according to a conventional method, and it was processed into a wafer to measure initial oxygen concentration. Subsequently, a density of BMDs was measured in the same manner as described above.

Moreover, a silicon single crystal was grown in Nv region according to a conventional method, and initial oxygen concentration and a density of BMDs were measured in the same manner as described above.

FIG. 6 shows a diagram plotting relation between the density of BMDs and the initial oxygen concentration of each wafer.

From the figure, it is found that the silicon wafer grown in the high oxygen precipitation Nv region has a high density of BMDs as a whole, and that the density of BMDs equal to, or higher than, that in a crystal of V region can be obtained. In particular, it is found that, even if the initial oxygen concentration is relatively low in a range of 20-24 ppma, high density of BMDs of 1×10$^7$ numbers/cm$^3$ or more is achieved, and therefore high gettering capability can be obtained.

To the contrary, it is found that, although the silicon wafer grown in the conventional Nv region has relatively high initial oxygen concentration of 24 ppma or more, the density of BMDs is less than that in the present invention as a whole, and dispersion thereof is large.

The present invention is not limited to the embodiment described above. The above-described embodiment is mere an example, and those having substantially the same structure as technical ideas described in the appended claims and providing the similar functions and advantages are included in the scope of the present invention.

For example, an apparatus used when producing a silicon single crystal in accordance with the present invention is not limited to the apparatus as shown in FIG. 2. It is possible to use without limitation an apparatus capable of growing a single crystal in a region which is located in N region outside OSF generated in a ring shape when performing thermal oxidation treatment and does not include a defect region detected by Cu deposition, and in which at least the center of the single crystal is within a high oxygen precipitation Nv region which has a density of BMDs of $1×10^7$ numbers/cm$^3$ or more and/or wafer lifetime of 30 μsec or less when performing oxygen precipitation treatment.

The invention claimed is:

1. A silicon single crystal wafer grown by Czochralski method, wherein the wafer is within a region which is a N region outside OSF generated in a ring shape when performing a thermal oxidation treatment and doesn't include a defect region detected by Cu deposition, and at least the center of the wafer is within a high oxygen precipitation Nv region which has a density of BMDs of $1×10^7$ numbers/cm$^3$ or more and/or a wafer lifetime of 30 μsec or less after an oxygen precipitation treatment.

2. The silicon single crystal wafer according to claim 1, wherein the high oxygen precipitation Nv region exists in a region of 80 % or more of a plane of the wafer.

3. An epitaxial wafer, wherein an epitaxial layer is formed on the silicon single crystal wafer according to claim 2.

4. An epitaxial wafer, wherein an epitaxial layer is formed on the silicon single crystal wafer according to claim 1.

5. A method for producing a silicon single crystal by Czochralski method, wherein the single crystal is grown in a region which is within N region outside OSF generated in a ring shape when performing thermal oxidation treatment and doesn't include a defect region detected by Cu deposition, and in which at least the center of the single crystal is within a high oxygen precipitation Nv region which has a density of BMDs of $1×10^7$ numbers/cm$^3$ or more and/or a wafer lifetime of 30 μsec or less after oxygen precipitation treatment.

6. The method for producing a silicon single crystal according to claim 5, wherein the single crystal is grown so that the high oxygen precipitation Nv region exists in a region of 80 % or more of a plane.

7. The method for producing a silicon single crystal according to claim 6, wherein the oxygen precipitation treatment comprises steps of performing a pretreatment in a nitrogen atmosphere of 400-700° C. for 20 minutes 5 hours, subsequently performing a dry oxidation at 700-900° C. for 3-5 hours, and then performing a dry oxidation treatment at 900-1100° C. for 10-20 hours.

8. The method for producing a silicon single crystal according to claim 7, wherein the single crystal is grown with controlling initial oxygen concentration in the silicon single crystal to 20 ppma (ASTM'79) or more.

9. The method for producing a silicon single crystal according to claim 6, wherein the single crystal is grown with controlling initial oxygen concentration in the silicon single crystal to 20 ppma (ASTM'79) or more.

10. The method for producing a silicon single crystal according to claim 5, wherein the oxygen precipitation treatment comprises steps of performing a pretreatment in a nitrogen atmosphere of 400-700° C. for 20 minutes-5 hours, subsequently performing a dry oxidation at 700-900° C. for 3-5 hours, and then performing a dry oxidation treatment at 900-1100° C. for 10-20 hours.

11. The method for producing a silicon single crystal according to claim 10, wherein the single crystal is grown with controlling initial oxygen concentration in the silicon single crystal to 20 ppma (ASTM'79) or more.

12. The method for producing a silicon single crystal according to claim 5, wherein the single crystal is grown with controlling an initial oxygen concentration in the silicon single crystal to 20 ppma (ASTM'79) or more.

13. A method for producing a silicon single crystal by Czochralski method, wherein the single crystal is grown with controlling a growth rate between a growth rate at a boundary where a defect region detected by Cu deposition remaining after disappearance of OSF ring disappears when gradually decreasing a growth rate of silicon single crystal during pulling and a growth rate at a boundary where a high oxygen precipitation Nv region having a density of BMDs of $1×10^7$ numbers/cm$^3$ or more and/or a wafer lifetime of 30 μsec or less after oxygen precipitation treatment disappears when gradually decreasing the growth rate further.

14. The method for producing a silicon single crystal according to claim 13, wherein the oxygen precipitation treatment comprises steps of performing a pretreatment in a nitrogen atmosphere of 400-700° C. for 20 minutes 5 hours, subsequently performing a dry oxidation at 700-100° C. for 3-5 hours, and then performing a dry oxidation treatment at 900-1100° C. for 10-20 hours.

15. The method for producing a silicon single crystal according to claim 14, wherein the single crystal is grown with controlling initial oxygen concentration in the silicon single crystal to 20 ppma (ASTM'79) or more.

16. The method for producing a silicon single crystal according to claim 13, wherein the single crystal is grown with controlling initial oxygen concentration in the silicon single crystal to 20 ppma (ASTM'79) or more.

* * * * *